US010644141B2

(12) United States Patent
Leendertz et al.

(10) Patent No.: US 10,644,141 B2
(45) Date of Patent: May 5, 2020

(54) POWER SEMICONDUCTOR DEVICE WITH DV/DT CONTROLLABILITY

(71) Applicant: Infineon Technologies Austria AG, Villach (AT)

(72) Inventors: Caspar Leendertz, Munich (DE); Markus Bina, Grosshelfendorf (DE); Christian Philipp Sandow, Haar (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/241,303

(22) Filed: Jan. 7, 2019

(65) Prior Publication Data

US 2019/0214490 A1 Jul. 11, 2019

(30) Foreign Application Priority Data

Jan. 8, 2018 (DE) ........................ 10 2018 100 237

(51) Int. Cl.
*H01L 29/76* (2006.01)
*H01L 29/739* (2006.01)
(Continued)

(52) U.S. Cl.
CPC ........ *H01L 29/7397* (2013.01); *H01L 21/761* (2013.01); *H01L 21/823487* (2013.01);
(Continued)

(58) Field of Classification Search
CPC ........... H01L 29/7397; H01L 29/66348; H01L 29/1095; H01L 29/0696; H01L 29/0623; H01L 21/761; H01L 21/407; H01L 29/0619; H01L 29/7395; H01L 29/6634; H01L 29/7813; H01L 29/4236;
(Continued)

(56) References Cited

U.S. PATENT DOCUMENTS 9,748,229 B2 * 8/2017 Hikasa ................ H01L 29/7397
10,388,773 B2 * 8/2019 Sumitomo ............ H01L 29/407
(Continued)

FOREIGN PATENT DOCUMENTS

WO 2017033315 A1 3/2017
WO 2017099096 A1 6/2017
WO 2017141998 A1 8/2017

*Primary Examiner* — Shouxiang Hu
(74) *Attorney, Agent, or Firm* — Murphy, Bilak & Homiller, PLLC

(57) ABSTRACT

A power semiconductor device having an IGBT-configuration includes at least one power cell. Each power cell includes at least three trenches arranged laterally adjacent to each other. Each trench extends into a semiconductor body along a vertical direction and includes an insulator that insulates a respective electrode from the semiconductor body. The at least three trenches include at least one control trench whose electrode is electrically coupled to a control terminal, and a source trench whose electrode is electrically coupled to a first load terminal. An active mesa for conduction of at least a part of the load current is laterally confined at least by one of the at least one control trench and includes at least a respective section of each of a source region and a channel region. An auxiliary mesa is laterally confined by the source trench and one of the at least one control trench.

23 Claims, 8 Drawing Sheets

(51) Int. Cl.
*H01L 29/40* (2006.01)
*H01L 29/06* (2006.01)
*H01L 29/66* (2006.01)
*H01L 29/78* (2006.01)
*H01L 29/423* (2006.01)
*H01L 21/8234* (2006.01)
*H01L 21/761* (2006.01)
*H01L 29/10* (2006.01)

(52) U.S. Cl.
CPC ...... *H01L 29/0619* (2013.01); *H01L 29/0623* (2013.01); *H01L 29/0696* (2013.01); *H01L 29/1095* (2013.01); *H01L 29/407* (2013.01); *H01L 29/4236* (2013.01); *H01L 29/6634* (2013.01); *H01L 29/66333* (2013.01); *H01L 29/66348* (2013.01); *H01L 29/7393* (2013.01); *H01L 29/7395* (2013.01); *H01L 29/7813* (2013.01)

(58) Field of Classification Search
CPC ........... H01L 29/7393; H01L 29/66333; H01L 21/823487
See application file for complete search history.

(56) References Cited

U.S. PATENT DOCUMENTS

2013/0037853 A1* 2/2013 Onozawa ............ H01L 29/0661
257/139
2015/0144988 A1* 5/2015 Laven ................. H01L 29/7397
257/139

* cited by examiner

POWER SEMICONDUCTOR DEVICE WITH DV/DT CONTROLLABILITY

TECHNICAL FIELD

This specification refers to embodiments of a power semiconductor device and to embodiments of a method of processing a power semiconductor device. In particular, this specification is directed to embodiments of a power semiconductor device having one or more power cells that each comprise at least one auxiliary mesa, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, usually referred to as gate electrode. For example, upon receiving a corresponding control signal from, e.g., a driver unit, the control electrode may set the power semiconductor device in one of a conducting state and a blocking state.

In some cases, the gate electrode may be included within a trench of the power semiconductor device. Such trench occasionally includes more than only one electrode, e.g., two or more electrodes that are arranged separately from each other and sometimes also electrically insulated from each other. For example, a trench may comprise both a gate electrode and a source electrode, wherein the gate electrode can be electrically insulated from each of the load terminals, and wherein the source electrode can be electrically connected to one of the load terminals.

It is usually desirable to keep losses, e.g., switching losses, of the power semiconductor device low. For example, low switching losses may be achieved by ensuring short switching durations, e.g., a short turn-on duration and/or a short turn-off duration. On the other hand, in a given application, there may also be requirements regarding a maximum slope of the voltage (dV/dt) and/or a maximum slope of the load current (dI/dt).

SUMMARY

According to an embodiment, a power semiconductor device has an IGBT-configuration and comprises: a semiconductor body coupled to a first load terminal and a second load terminal of the power semiconductor device, and being configured to conduct a load current between said terminals, and comprising a drift region of a first conductivity type; a control terminal for controlling the load current; a source region of the first conductivity type electrically connected with the first load terminal, and a channel region of a second conductivity type electrically connected with the first load terminal and isolating the source region from the drift region; an emitter region of the second conductivity type electrically connected to the second load terminal; at least one power cell. Each power cell includes at least three trenches arranged laterally adjacent to each other, wherein each of said trenches extends into the semiconductor body along a vertical direction and includes an insulator that insulates a respective electrode from the semiconductor body, wherein the at least three trenches include at least one control trench, whose electrode is electrically coupled to the control terminal, and a source trench, whose electrode is electrically coupled to the first load terminal; an active mesa for conduction of at least a part of the load current, the active mesa being laterally confined at least by one of the at least one control trench and comprising at least a respective section of each of the source region and the channel region; and an auxiliary mesa laterally confined by the source trench and one of the at least one control trench, the auxiliary mesa comprising a first semiconductor portion and a second semiconductor portion, both of the second conductivity type, wherein the auxiliary mesa is electrically connected to the first load terminal by means of the first semiconductor portion, and wherein the second semiconductor portion is arranged below the first semiconductor portion while being spatially displaced therefrom along the vertical direction.

According to another embodiment, a method of processing a power semiconductor device is presented. The semiconductor device has an IGBT-configuration and comprises: a semiconductor body coupled to a first load terminal and a second load terminal of the power semiconductor device, and being configured to conduct a load current between said terminals, and comprising a drift region of a first conductivity type; a control terminal for controlling the load current; a source region of the first conductivity type electrically connected with the first load terminal, and a channel region of a second conductivity type electrically connected with the first load terminal and isolating the source region from the drift region; an emitter region of the second conductivity type electrically connected to the second load terminal; at least one power cell. Each power cell includes at least three trenches arranged laterally adjacent to each other, wherein each of said trenches extends into the semiconductor body along a vertical direction and includes an insulator that insulates a respective electrode from the semiconductor body, wherein the at least three trenches include at least one control trench, whose electrode is electrically coupled to the control terminal, and a source trench, whose electrode is electrically coupled to the first load terminal; an active mesa for conduction of at least a part of the load current, the active mesa being laterally confined at least by one of the at least one control trench and comprising at least a respective section of each of the source region and the channel region. The method comprises providing, as a part of each of the at least one power cell, an auxiliary mesa laterally confined by the source trench and one of the at least one control trench, the auxiliary mesa comprising a first semiconductor portion and a second semiconductor portion, both of the second conductivity type, wherein the auxiliary mesa is electrically connected to the first load terminal by means of the first semiconductor portion, and wherein the second semiconductor portion is arranged below the first semiconductor portion while being spatially displaced therefrom along the vertical direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
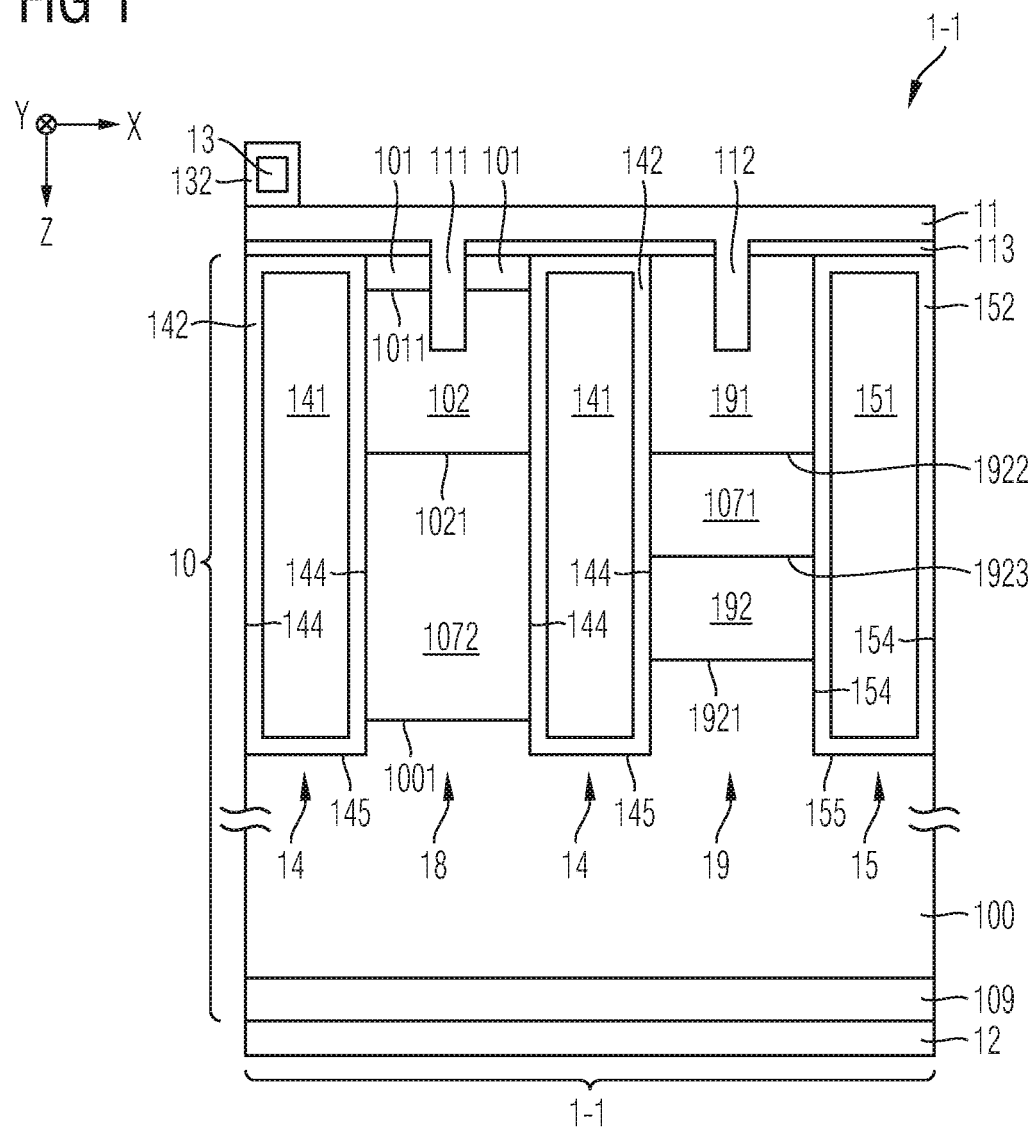
FIGS. 1-3 each schematically and exemplarily illustrates a section of a vertical cross-section of a power semiconductor device in accordance with some embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below may be an extension direction Z is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more (active) power cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V.

For example, the power semiconductor device described below may be a semiconductor device exhibiting a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Regarding all embodiments described herein, the power semiconductor device can be an IGBT; e.g., the power semiconductor device is not a MOSFET. Further, still regarding all embodiments described herein, the power semiconductor device can be an IGBT with unidirectional current capability, e.g., the power semiconductor device is not a RC-IGBT.

In the following, it will be referred to each of FIGS. 1-8.

The power semiconductor device 1 comprises a semiconductor body 10 that is coupled to a first load terminal 11 and a second load terminal 12. For example, the first load terminal 11 is an emitter terminal, and the second load terminal 12 can be a collector terminal. The first load terminal 11 may be arranged on the front side of the power semiconductor device 1 and may include a front side metallization. The second load terminal 12 may be arranged, opposite to the front side, e.g., on a back side of the power semiconductor device 1 and may include, for example, a back side metallization. Accordingly, the power semiconductor device 1 may exhibit a vertical configuration. In another embodiment, each of the first load terminal 11 and the second load terminal 12 may be arranged on a common side, e.g., both on the front side, of the power semiconductor device 1.

Figure 5:
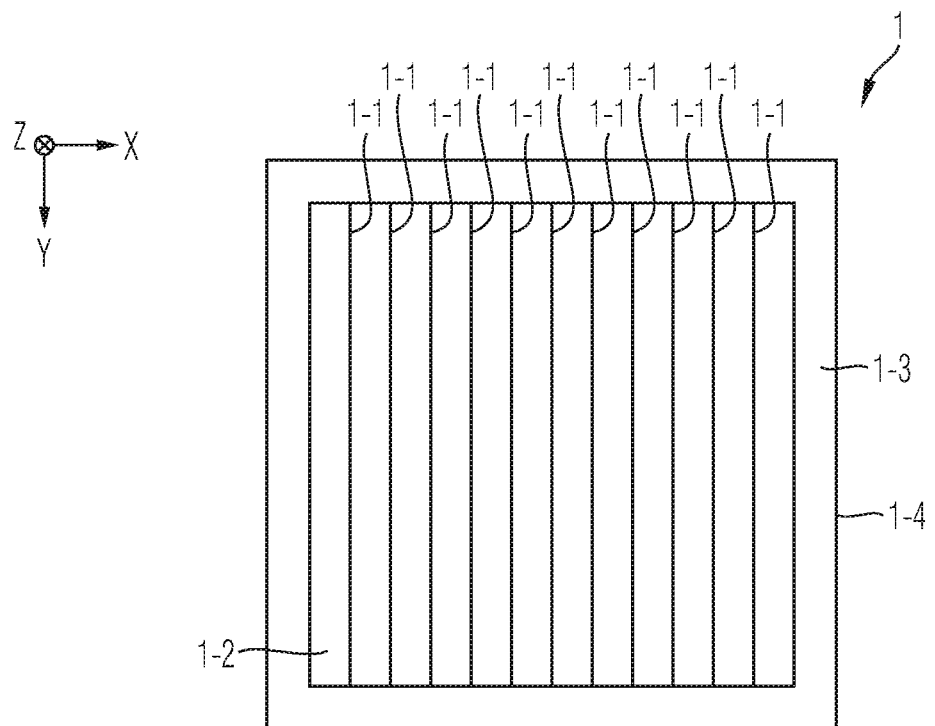
FIG. 5 schematically and exemplarily illustrates a section of a horizontal projection of a power semiconductor device in accordance with one or more embodiments.

The power semiconductor device 1 can include an active region 1-2, an edge termination region 1-3 and a chip edge 1-4 (cf. FIG. 5). The semiconductor body 10 may form a part of each of the active region 1-2 and the edge termination region 1-3, wherein chip edge 1-4 may laterally terminate the semiconductor body 10. The chip edge 1-4 may have become into being by means of wafer dicing, for example, and may extend along the vertical direction Z. The edge termination region 1-3 may be arranged between the active region 1-2 and the chip edge 1-4, as illustrated in FIG. 5.

In the present specification, the terms "active region" and "edge termination region" are employed in a common manner, i.e., the active region 1-2 and the edge termination region 1-3 may be configured to provide for the principle technical functionalities typically associated therewith. For example, the active region 1-2 of the power semiconductor device 1 is configured to conduct a load current between the terminals 11, 12, whereas the edge termination region 1-3 does not conduct the load current, but rather fulfills functions regarding the course of the electric field, ensuring the blocking capability, safely terminating the active region 1-2 and so forth, in accordance with an embodiment. For example, the edge termination region 1-3 may entirely surround the active region 1-2, as illustrated in FIG. 5.

The power semiconductor device 1 comprises at least one power cell 1-1. In an embodiment, the power semiconductor device 1 comprises a plurality of such power cells 1-1, e.g., within the active region 1-2. The number of power cells 1-1 may be greater than 100, than 1000, or even greater than 10,000. The power cells 1-1 may each exhibit an identical configuration. Thus, in an embodiment, each power cell 1-1 may exhibit a configuration of a power unit cell, e.g., as illustrated in one or more of FIGS. 1-8. In the following, when an explanation is presented for an exemplary configuration of a specific power cell 1-1 (e.g., like "the power cell 1-1 comprises . . . " or "the component of the power cell 1-1 is/has . . . "), this explanation may equally apply to all power cells 1-1 that may be included in the power semiconductor device 1, if not explicitly state otherwise.

Figure 4:
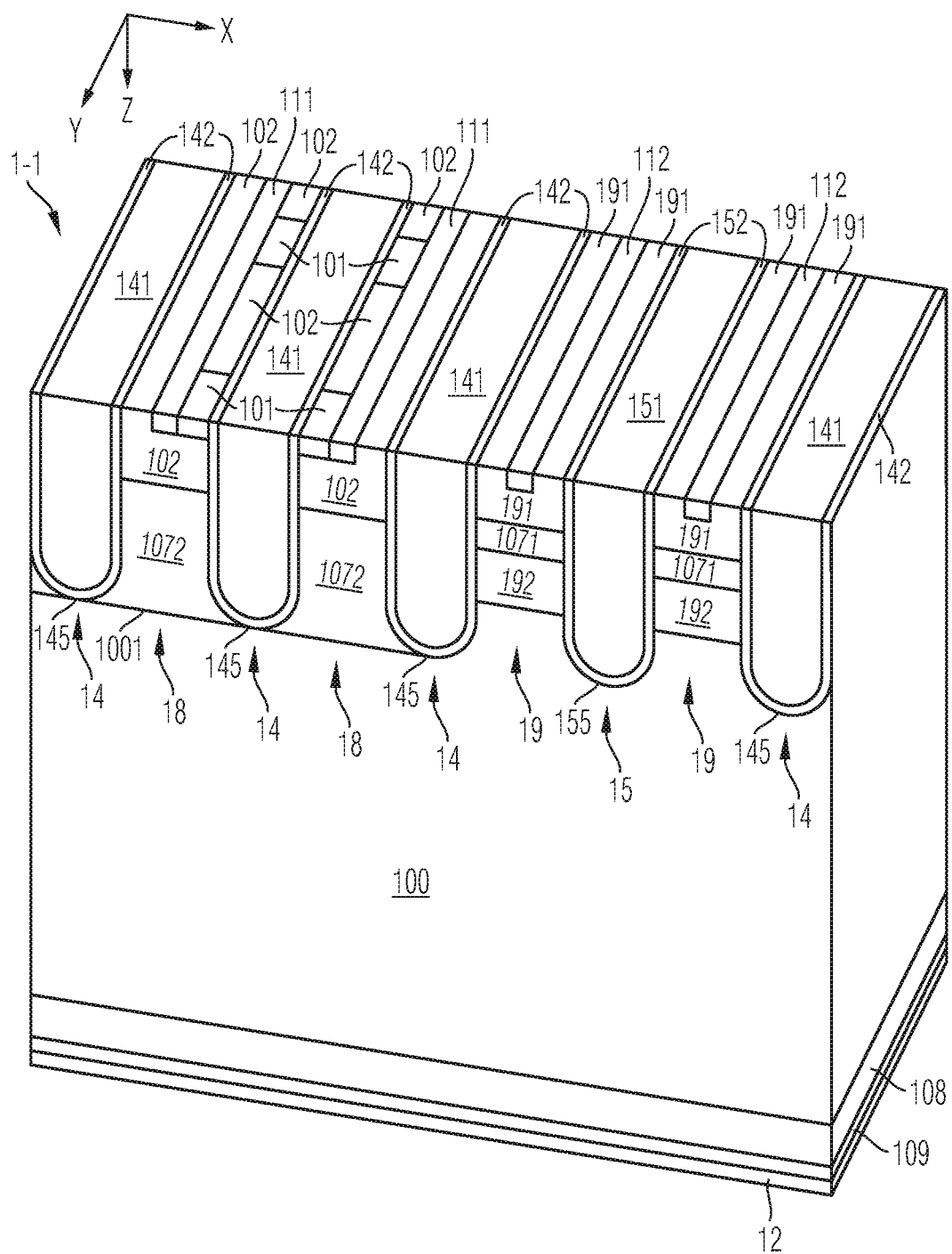
FIG. 4 schematically and exemplarily illustrates a section of a perspective projection of a power semiconductor device in accordance with one or more embodiments.

Each power cell 1-1 may exhibit a stripe configuration as schematically illustrated in FIGS. 4 and 5, wherein the total lateral extension in one lateral direction, e.g., along with the second lateral direction Y, of each power cell 1-1 and its components may be substantially greater than the total lateral extension in the other lateral direction, e.g., along the first lateral direction X.

In another embodiment, each power cell 1-1 may exhibit a cellular configuration, wherein the lateral extensions of each power cell 1-1 may be substantially smaller than the total lateral extensions of the active region 1-2. However, the present disclosure rather relates to embodiments of the power semiconductor device 1 in which the power cells 1-1 have a stripe configuration.

Referring to all embodiments disclosed herein, each of the power cells 1-1 may exhibit a stripe configuration and can be configured to provide for an IGBT functionality. Further, each power cell 1-1 may be electrically connected with the first load terminal 11. Each power cell 1-1 may be configured to conduct a part of the load current between said terminals 11 and 12, and to block a blocking voltage applied between said terminals 11 and 12.

For controlling the load current, the power semiconductor device 1 may comprise a control terminal 13. The control terminal 13 can be configured to receive a control signal for controlling the load current. Such control signal can be provided by a driver (not illustrated), for example. The control terminal 13 may be electrically insulated from the first load terminal 11 and the second load terminal 12, e.g., by means of an insulation structure 132. In an embodiment, the control terminal 13 is a gate terminal. For example, the power semiconductor device 1 is an IGBT that is configured to be controlled based on a gate-emitter-voltage $V_{GE}$, e.g., in a principle manner of controlling an IGBT known to the skilled person, wherein the gate-emitter-voltage, i.e., a voltage between the first load terminal 11 and the control terminal 13, can be provided by the driver.

The semiconductor body 10 comprises a drift region 100 of the first conductivity type. For example, the extension of the drift region 100 along the vertical direction Z and its dopant concentration are chosen in dependence of the blocking voltage rating for which the power semiconductor device 1 shall be designed, e.g., in a manner as it is known to the skilled person. The drift region can be n-doped, e.g., at a dopant concentration within the range of $6*10^{12}$ to $1.1*10^{14}$ cm$^{-3}$.

Each power cell 1-1 may extend at least partially into the semiconductor body 10 and comprise at least a section of the drift region 100.

Figure 6:
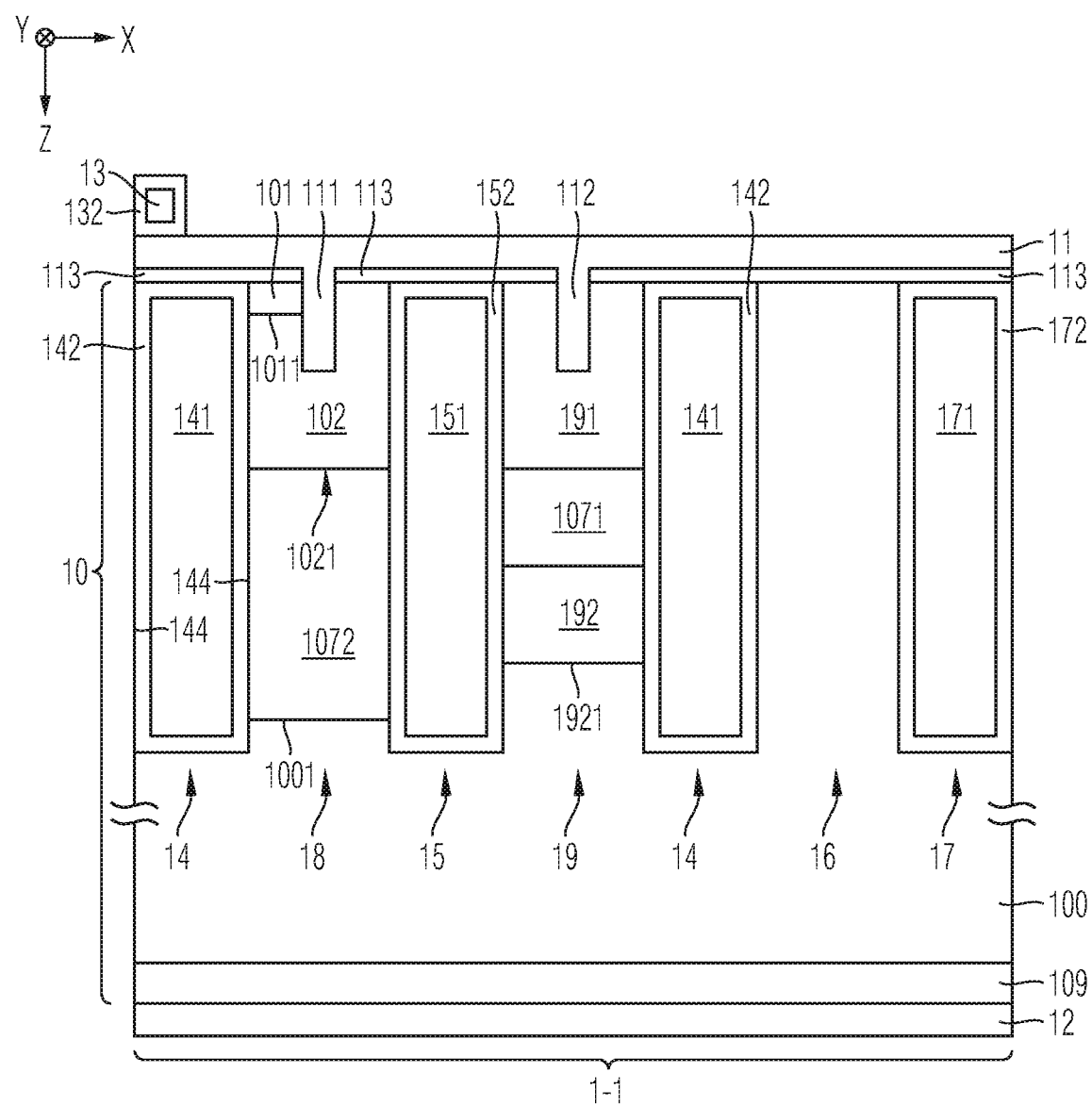
FIGS. 6-8 each schematically and exemplarily illustrates a section of a vertical cross-section of a power semiconductor device in accordance with some embodiments.

The drift region 100 may extend along the vertical direction Z until it interfaces with an emitter region 109 that is arranged in electrical contact with the second load terminal 12 (cf. FIGS. 1, 4 and 6). The emitter region 109 may be formed in accordance with the configuration of the power semiconductor device 1; e.g., the doped contact region 109 is an emitter region of the second conductivity type, e.g. a p-type emitter region 109. Hence, the emitter region 109 can be a back side emitter of the second conductivity type that is electrically connected to the second load terminal 12. For example, the emitter region 109 is arranged in contact with the second load terminal 12.

In an embodiment, the emitter region 109 is exclusively of the second conductivity type and laterally overlaps entirely with each of the power cells 1-1. For example, thereby, an IGBT with unidirectional current capability may be formed. E.g., none of the power cells 1-1 laterally overlaps with a back side emitter region of the first conductivity type.

In between the emitter region 109, the semiconductor body 10 may have a field stop region 108 (cf. FIG. 4) that couples the drift region 100 to the doped contact region 109. For example, the field stop region 108 is of the first conductivity type at a dopant concentration significantly greater than the dopant concentration of the drift region 100.

The semiconductor body 10 further comprises a source region 101 of the first conductivity type electrically connected with the first load terminal 11, and a channel region 102 of the second conductivity type electrically connected with the first load terminal 11 and isolating the source region 101 from the drift region 100. A transition between the channel region 102 and the drift region 100 may form a pn-junction 1021.

The dopant concentration of the source region 101 can be significantly greater than the dopant concentration of the drift region 100. For example, the dopant concentration of the source region 101 is within the range of $1*10^{19}$ to $5*10^{20}$ cm$^{-3}$. In contrast to the schematic illustration in FIG. 1, it shall be understood that the source region 101 can also only be present at one side of the first contact plug 111, e.g., a left (with respect to the first lateral direction X) part of the active mesa 18 includes the source region section 101, and a right part of the active mesa 18 includes a portion of the channel region section 102. Such asymmetric arrangement can be implemented irrespective of whether the electrical connection between the active mesa 18 and the first load terminal 11 is implemented by means of a first contact plug 111, as illustrated, or by means of another connection (e.g., a planar contact).

The dopant concentration of the channel region 102 can be within the range of $1*10^{16}$ to $5*10^{18}$ cm$^{-3}$, e.g., approximately $1*10^{17}$ cm$^{-3}$. But, the channel region 102 may also comprise a channel subregion 1025 that forms a part of an interface region between the first load terminal 11 and the remaining portion of the channel region 102 and that exhibits a significantly increased dopant concentration as compared to the remaining portion of the channel region 102.

Each cell 1-1 of the power semiconductor comprises at least three trenches 14, 15 arranged laterally adjacent to each other. Each of said trenches 14, 15 extends into the semiconductor body 10 along the vertical direction Z and includes an insulator 142, 152 that insulates a respective electrode 141, 151 from the semiconductor body 10. The at least three trenches 14, 15 include at least one control trench 14 (e.g., two or more control trenches 14), whose electrode (s) 141 is/are electrically coupled to the control terminal 13, and a source trench 15, whose electrode 151 is electrically coupled to the first load terminal 11.

The control electrode(s) 141 may be electrically connected to the control terminal 13, and the source electrode(s) 151 may be electrically connected to the first load terminal 11.

The trench electrodes 141, 151 may be electrically insulated from the semiconductor body 10 by means of a respective trench insulator 142, 152. In the lateral direction, e.g., in the first lateral direction X, the trenches 14, 15 may be terminated by respective trench side walls 144, 154, and in the vertical direction Z, the trenches 14, 15 may be terminated by respective trench bottom 145, 155.

The control electrode(s) 141 and the source electrode(s) 151 may each exhibit identical spatial dimensions. Further, the control trench(es) 14 and the source trench(es) may each exhibit identical spatial dimensions and/or may be identically arranged with respect to the vertical direction Z and the second lateral direction Y.

In each cell 1-1, the trenches laterally confine at least one active mesa 18. E.g., the (at least one) active mesa 18 is configured for conduction of at least a part of the load current, wherein the active mesa 18 is laterally confined at least by one of the at least one control trench 14 and comprises at least a respective section of each of the source region 101 and the channel region 102. The active mesa 18 may also be laterally confined by two control trenches 14, as illustrated. The sidewall(s) of the control trench(es) 14 may be in contact with the source region section 101 and the channel region section 102.

As used herein, the term "mesa" may designate a section of the semiconductor body 10 that extends between two trench sidewalls of two adjacent trenches facing to each other and that has substantially the same total extension in the vertical direction Z as said two adjacent trenches.

Figure 2:
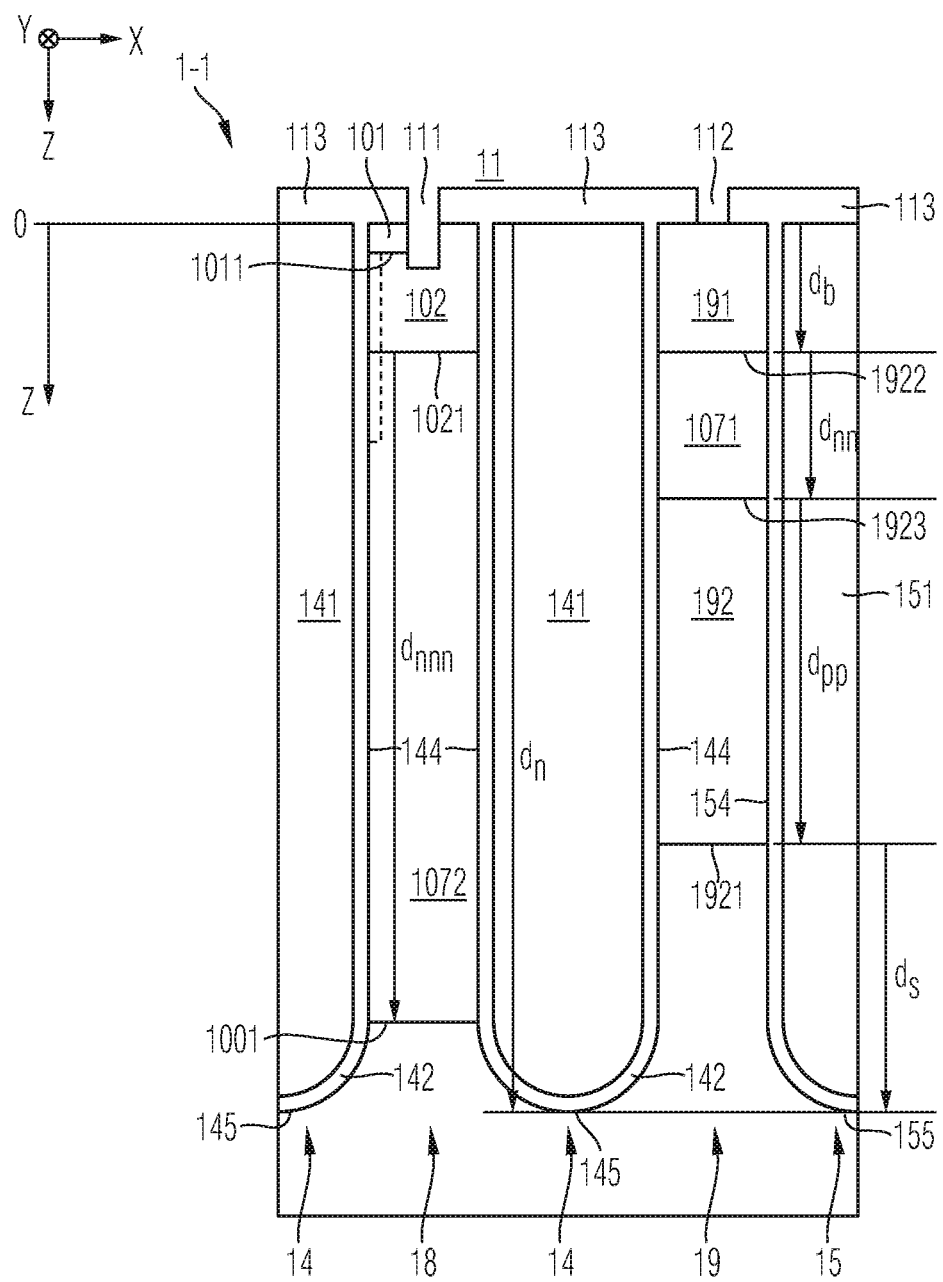

For example, the source region section 101 and the channel region section 102 of the active mesa 18 may be electrically connected to the first load terminal 11 by means of the first contact plug 111 already mentioned above. A transition 175 between the first load terminal 11 and the active mesa 18 may provide for an interface for the load current to pass from the first load terminal 11 into the semiconductor body 10 and/or vice versa. The transition 175 between the active mesa 18 and the first load terminal 11 may be electrically conductive due to the first contact plug 111. For example, the first contact plug 111 penetrates an insulation layer 113 that in a section where it is not penetrated by the plug 11 isolates the semiconductor body 10 from the first load terminal 11. The first contact plug 111 may extend in the active mesa 18 so as to contact each of the source region section 101 and the channel region section 102. For example, the first contact plug 111 is arranged at a lateral central position with respect to the mesa extension in the first lateral direction X. Further, as indicated above, it shall be understood that the source region 101 may be arranged on both sides of the first contact plug 111, e.g., in a symmetrical manner, as illustrated in FIG. 1, or only arranged adjacent to one of the sides of the first contact plug 111, e.g., on that side that is closest to the control trench 14 that controls the load current in the active mesa 18, as illustrated in FIG. 2. In an embodiment of the power semiconductor device 1, the emitter region 109 is a p-type emitter, and the active mesa 18 entirely laterally overlaps with the p-type emitter 109. Also, the electrical connection between the active mesa 18 and the first load terminal 11 may be realized by means different from the illustrated first contact plug 111, e.g., by means of a planar contact that terminates approximately at a bottom of the insulation layer 113 (cf. FIGS. 7 and 8).

For controlling the power semiconductor device 1, each power cell 1-1 may be operatively coupled to or, respectively, comprise a control electrode 141 configured to selectively set the respective power cell 1-1 into one of a conducting state and a blocking state. For example, the control electrode 141 of (one of) the control trench(es) 14 that spatially confine(s) the active mesa 18 is configured to induce an inversion channel in the channel region 102.

Figure 3:
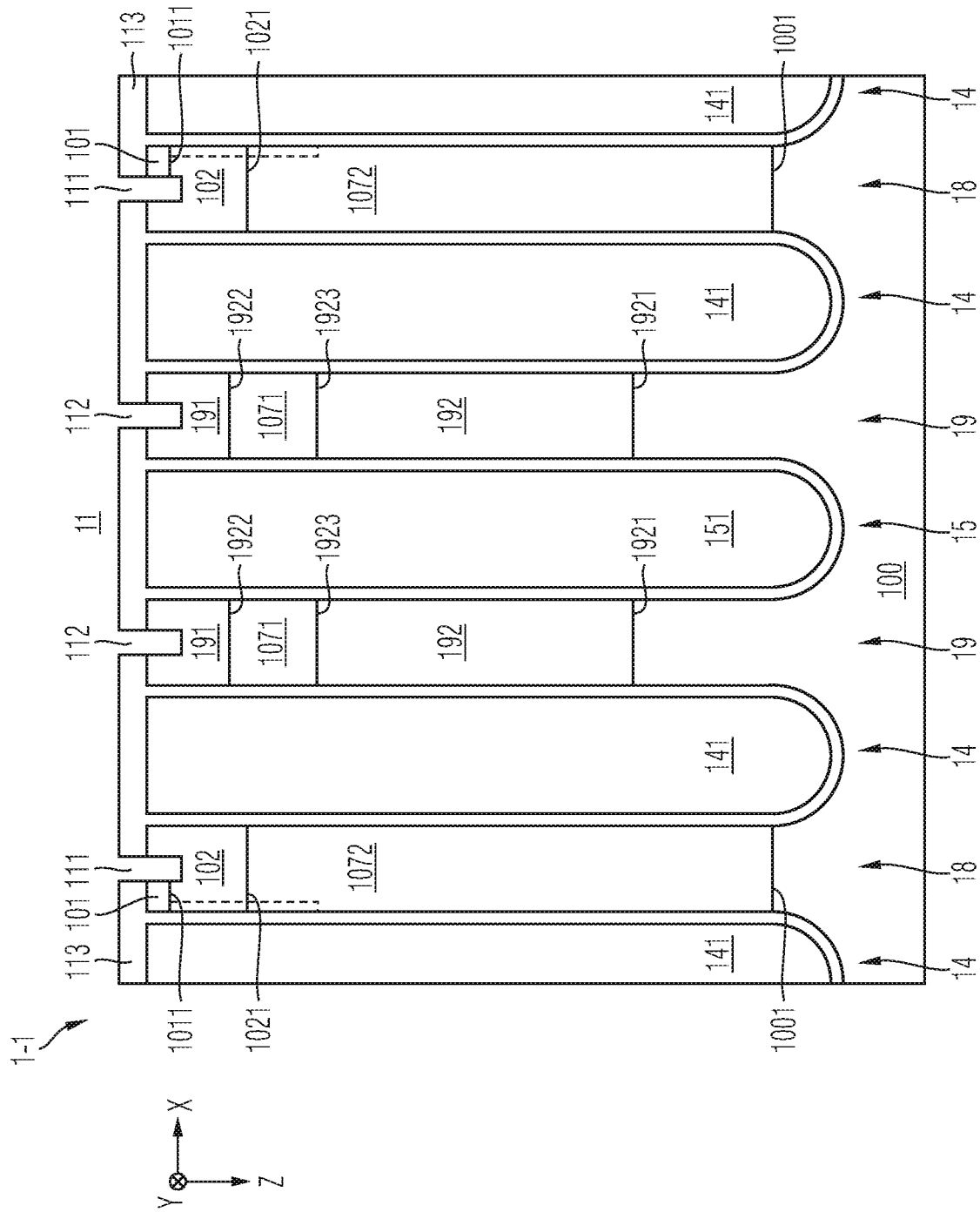

For example, the first type mesa 17 comprises the source region 101 and the channel region 102, wherein these regions 101 and 102 may be electrically connected to the first load terminal 11 by means of a first contact plug 111. A transition 175 between the first load terminal 11 and the first type mesa 17 may provide for an interface for the load current to pass from the first load terminal 11 into the semiconductor body 10 and/or vice versa. The transition 175 between the first type mesa 17 and the first load terminal 11 may be electrically conductive due to the first contact plug 111. For example, the first contact plug 111 penetrates an insulation layer 112 that in section where it is not penetrated by the plug 11 isolates the semiconductor body 10 from the first load terminal 11. The first contact plug 111 may extend in the first type mesa 17 so as to contact each of the source region 101 and the channel region 102. For example, the first contact plug 111 is arranged at a lateral central position with respect to the mesa extension in the first lateral direction X. Further, it shall be understood that the source region 101 may be arranged on both sides of the contact plug, e.g., in a symmetrical manner, as illustrated in FIGS. 3 and 4, or only arranged adjacent to one of the sides of the first contact plug 111, e.g., on that side that is closest to the first type trench 14 that controls the load current in the first type mesa 17, as illustrated in FIG. 2. In an embodiment of the power semiconductor device 1, the doped contact region 109 is a p-type emitter, and the first type mesa 17 may entirely laterally overlap with the p-type emitter 109.

Now regarding in more detail in the embodiment schematically and exemplarily illustrated in FIG. 1, each power cell 1-1 may additionally comprise an auxiliary mesa 19 laterally confined by the source trench 15 and one of the at least one control trench 14. In the illustrated embodiment, the power cell 1-1 comprises two control trenches 14 and one source trench 15. The two control trenches 14 laterally confine the active mesa 18. The source trench 15 and one of the two control trenches 14 laterally confine the auxiliary mesa 19.

The auxiliary mesa 19 has a first semiconductor portion 191 and a second semiconductor portion 192, both of the second conductivity type. For example, both the first semiconductor portion 191 and the second semiconductor portion 192 are p-doped.

The auxiliary mesa 19 is electrically connected to the first load terminal 11 by means of the first semiconductor portion 191. The second semiconductor portion 192 is arranged below the first semiconductor portion 191 while being spatially displaced from along the vertical direction Z.

For establishing the electrical connection between the auxiliary mesa 19 and the first load terminal 11, there may optionally be provided a second contact plug 112 that extends along the vertical direction Z from the first load terminal 11 so as to make contact with the first semiconductor portion 191, only. Also the second contact plug 112 penetrates the insulation layer 113. However, it shall be understood that the second contact plug 112 must not necessarily extend further along the vertical direction Z as compared to a bottom of the insulation layer 113, as illustrated in FIG. 1, but e.g., only down to the bottom of the insulation layer 113, as will become apparent from other drawings. Further, also other means of establishing an electrical connection between the first semiconductor portion 191 and the first load terminal 11 may be used.

In an embodiment, the first semiconductor portion 191 of the auxiliary mesa 19 is a section of the channel region 102. Hence, the channel region section 102 present within the active mesa 18 and the first semiconductor portion 191 present within the auxiliary mesa 19 may be simultaneously produced and may exhibit the same dopants at the same dopant concentration and the same dopant concentration profiles, e.g., along the vertical direction Z.

Further, the auxiliary mesa 19 may comprise a first barrier region 1071 of the first conductivity type. For example, the first barrier region 1071 is n-doped. Hence, a transition between the first semiconductor portion 191 and the first barrier region 1071 forms a pn-junction 1922. According to the aforesaid, both the pn-junctions 1021 and 1922 may be positioned at approximately the same vertical level.

In an embodiment, the first barrier region 1071 is electrically floating. E.g., the first barrier region 1071 is not electrically connected to one of the load terminals 11, 12, nor to the control terminal 13. For example, in order to ensure that the first barrier region 1071 is electrically floating, the first barrier region 1071 is not ohmically connected to a fixed electrical potential, e.g., not ohmically connected to one of the load terminals 11, 12, nor to the control terminal 13.

The first semiconductor portion 191 and the second semiconductor portion 192 can be separated from each other by means of the first barrier region 1071. For example, the first barrier region 1071 has a minimum extension along the vertical direction Z within the range of 300 to 1250 nm. For example, the first barrier region's 1071 maximum extension along the vertical direction Z is chosen such that its bottom or, respectively, a pn-junction 1923 formed by a transition between the first barrier region 1071 and the second semiconductor portion 192 is arranged above the trench bottoms 145 and 155, i.e., within the auxiliary mesa 19. Further, the first barrier region 1071 may have the same width along the first lateral direction X as the auxiliary mesa 19, e.g., within the range of 300 to 1000 nm. Further, the first barrier region 1071 may have a dopant concentration at least twice as great as the dopant concentration of the drift region 100.

In an embodiment, the first semiconductor portion 191 entirely fills an upper portion of the auxiliary mesa 19, and the first barrier region 1071 entirely fills a central portion of the auxiliary mesa 19, and the second semiconductor portion 192 entirely fills a lower portion of the auxiliary mesa 19. Thus, in an embodiment, the auxiliary mesa 19 is electrically connected to the first load terminal 11 exclusively by means of the first semiconductor portion 191, and the auxiliary mesa 19 is coupled to the drift region 100 exclusively by means of the second semiconductor portion 192.

Also a pn-junction 1921 formed between the second semiconductor portion 192 and the drift region 100 may still be arranged within the auxiliary mesa 19. For example, the second semiconductor portion 192 does not extend out of the auxiliary mesa 19. A minimum extension along the vertical direction Z of the first semiconductor portion 191 may be identical to a minimum extension along the vertical direction Z of the channel region section 102 and/or amount up to 1000 nm, and a minimum extension of the second semiconductor portion 192 may be within the range of 100 to 2500 nm.

In an embodiment, the electrical connection between the first load terminal 11 and the auxiliary mesa 19 is exclusively formed by an electrically conductive path between the first load terminal 11 and the first semiconductor portion 191, i.e., the electrically conductive path (formed, e.g., by the second contact plug 112) does not contact an n-doped portion of the auxiliary mesa 19. For example, the auxiliary mesa 19 does not comprise a section of the source region 101 that would be electrically connected to the first load terminal 11, e.g., by means of the second contact plug 112.

In an embodiment, the active mesa 18 includes a second barrier region 1072 of the first conductivity type that exhibits a dopant concentration at least twice as great as the dopant concentration of the drift region 100. As illustrated, the second barrier region 1072 may separate the channel region section 102 from the drift region 100. A transition 1001 between the second barrier region 1072 and the drift region 100 may still be arranged within the active mesa 18 or, respectively, terminate approximately at the level of the control trench bottoms 145 (cf. FIG. 4). For example, the second barrier region 1072 extends along the vertical direction Z at least into the deepest tenth part of the active mesa 18.

In an embodiment, the active mesa 18 may hence exhibit a npn-semiconductor configuration, whereas the auxiliary mesa may exhibit a pnp-semiconductor configuration.

In an embodiment, the second barrier region 1072 is electrically floating. E.g., the second barrier region 1072 is not electrically connected to one of the load terminals 11, 12, nor to the control terminal 13. For example, in order to ensure that the second barrier region 1072 is electrically floating, the second barrier region 1072 is not ohmically connected to a fixed electrical potential, e.g., not ohmically connected to one of the load terminals 11, 12, nor to the control terminal 13.

The auxiliary mesa 19 can be configured to prevent a first current of charge carriers of the first conductivity type (e.g., electrons) from crossing the transition between the auxiliary mesa 19 and the first load terminal 11 and to allow a second current of charge carriers of the second conductivity type (e.g., holes) to cross said transition. Thus, the auxiliary mesa 19 may be regarded as a "hole-contact-mesa".

In accordance with some embodiments described herein, the auxiliary mesa 19 may be employed to influence the switching behavior of the device 1. For example, the power semiconductor device 1 is configured to be set into the conducting state if a control signal provided to the control electrode(s) 141 has a value within a first value range, and into a blocking state if the control signal has a value within a second value range. The electric resistivity of the auxiliary mesa 19 may be responsive to the value of the control signal, where the electric resistivity is greater if the control signal has a value within the first value range as compared to the electric resistivity present when the control signal has a value within the second value range. Hence, during the conducting state, drainage of charge carriers of the second conductivity type is avoided, and shortly before and/or during a turn-off operation and/or during the static blocking state, drainage of charge carriers of the second conductivity type is promoted via the auxiliary mesa 19.

For example, the electric resistivity of the auxiliary mesa 19 has a momentary minimum during the change of the value of the control signal from a value within the first value range to a value within the second value range. Thus, shortly before the device is turned-off, the drainage of charge carriers of the second conductivity type is modified via the auxiliary mesa 19. E.g., this may yield a better controllability of a voltage slope (dV/dt).

In an embodiment, the active mesa 18 is configured to conduct at least a part of the load current by means of the inversion channel (cf. dashed rectangular sections in FIGS. 2 and 3) induced within said section of the channel region 102 having a first inception voltage, and the auxiliary mesa 19 is configured to conduct at least a part of the load current by means of an accumulation channel having a second inception voltage. E.g., for achieving a time shift between cut-off of the inversion channel and the inducement of the accumulation channel, the second inception voltage can be different from the first inception voltage. E.g., this can be achieved by slightly different dopant concentrations within the channel region section 102 and the first semiconductor portion 191. For example, the dopant concentrations within the auxiliary mesa 19 are chosen (e.g., with respect to one or more of the total integrated amount, the concentration gradient/profile, the dopant type, the spatial distribution) so as to achieve a defined second inception voltage. Other possibilities of achieving said time shift between cut-off of the inversion channel and the inducement of the accumulation channel may additionally or alternatively be implemented, e.g., by providing a difference between a) the effective thickness of the control trench insulator 142 between the channel region section 102 and the control electrode 141 and b) the effective thickness of the control trench insulator 142 between the first semiconductor portion 191 and the control electrode 141. In another embodiment, e.g., if the active mesa 18 and the auxiliary mesa 19 are controlled by separate respective control trenches 14, the control trench electrodes could be provided with different work functions and/or supplied with different control signals. For example, in the latter cases, the time shift between cut-off of the inversion channel and the inducement of the accumulation channel could also be achieved in case the second inception voltage is identical to the first inception voltage.

Now regarding in more detail the embodiment schematically and exemplarily illustrated in FIG. 2, with respect to the electrical connections between the first load terminal 11 and the active mesa 18 and the auxiliary mesa 19, it is emphasized, as already indicated above, that within the active mesa 18, the source region section 101 can only be present at one side of the first contact plug 111, as illustrated. Further, the second contact plug 112 must not necessarily extend further as compared to the bottom of the insulation layer 113, as illustrated.

Using the bottom of the insulation layer 113 as the basis, both the channel region section 102 and the first semiconductor portion 191 may exhibit the total extension $d_b$ along the vertical direction Z. The first barrier region 1071 may exhibit the total extension $d_{nn}$ along the vertical direction Z. The second semiconductor portion 192 may exhibit the total extension $d_{pp}$ along the vertical direction Z. A distance between the pn-junction 1921 and the source trench bottom 155 along the vertical direction Z may amount to $d_s$. The second barrier region 1072 may exhibit the total extension $d_{nnn}$ along the vertical direction Z. The total extension along the vertical direction Z of both the auxiliary mesa 19 and the active mesa 18 may amount to $d_n$. With these abbreviations, one or more or all of the following exemplary design rules may be obeyed within the mesas 18 and 19:

First of all, it is clear that equation (1)

$$d_b + d_{nn} + d_{pp} + d_s = d_n \quad (1)$$

applies. Further, the total extension of the second semiconductor portion 192 may be at least as great as the total extension of the first barrier region 1071 along the vertical direction Z. Hence, equation (2) may apply $$d_{pp} >= d_{nn} \quad (2)$$

As has already been indicated above, the pn-junction 1921 formed between the second semiconductor portion 192 and the drift region 100 may be located within the auxiliary mesa 19. In this respect, equation (3) may apply $$d_n > d_b + d_{nn} + d_{pp} \quad (3)$$

or, respectively $$d_n - d_b > + d_{nn} + d_{pp} \quad (3)$$

More specifically, a distance between the pn-junction 1921 and the source trench bottom 145 may be equal to or greater than one tenth of the total extension $d_n$ of the auxiliary mesa 19. Hence, also equation (4) may apply $$d_s >= d_n/10 \quad (4)$$

Regarding dopant concentrations of the semiconductor regions present within the mesas 18 and 19, some exemplary values have already been indicated above. Summarizing, in an embodiment, one or more or all of the following exemplary design rules may be obeyed:

(i) The dopant concentration of the source region section 101 is within the range of $1*10^{19}$ to $5*10^{20}$ cm$^{-3}$.

(ii) The dopant concentration of the source region section 101 is greater than each of the dopant concentration of the first barrier region 1071, of the second barrier region 1072 and of the drift region 100.

(iii) The dopant concentration of the channel region section 102 is within the range of $1*10^{16}$ to $5*10^{18}$ cm$^{-3}$.

(iv) The dopant concentration of the first semiconductor portion 191 is identical to the dopant concentration of the channel region section 102. Or, the dopant concentration of the first semiconductor portion 191 slightly deviates from the dopant concentration of the channel region section 102, e.g., so as to achieve said difference between the inception voltages of the inversion channel and the accumulation channel.

(v) The dopant concentration of the first barrier region 1071 is within the range of $1*10^{16}$ to $5*10^{18}$ cm$^{-3}$.

(vi) The dopant concentration of the second barrier region 1072 is within the range of $5*10^{16}$ to $1*10^{18}$ cm$^{-3}$.

(vii) The first barrier region 1071 and the second barrier region 1072 exhibit at least approximately the same dopant concentrations.

(viii) The dopant concentration of the second semiconductor portion 192 is within the range of $2.5*10^{16}$ to $1*10^{18}$ cm$^{-3}$.

(ix) The dopant concentration of the second semiconductor portion 192 is as great as or lower than the dopant concentration of the first semiconductor portion 191 (i.e., the dopant concentration of the first semiconductor portion 191 can be greater than the dopant concentration of the second semiconductor portion 192).

(x) The dopant concentration of the first barrier region 1071 is within the range of 90% to 130% of the dopant concentration of the second barrier region 1072, e.g., greater than 30% of the dopant concentration of the second barrier region 1072.

(xi) The dopant concentration of the first semiconductor portion 191 exhibits a first profile identical to a dopant concentration profile of the channel region 102. For example, this can be achieved by producing the first semiconductor portion 191 and the channel region section 102 by joint processing steps. Or, the dopant concentration profile of the first semiconductor portion 191 slightly deviates from the dopant concentration profile of the channel region section 102, e.g., so as to achieve said difference between the inception voltages of the inversion channel and the accumulation channel.

(xii) The dopant concentration of the second semiconductor portion 192 (which is of the second conductivity type) exhibits a second profile, the second profile being an implantation profile that has a dopant dose within the range of 80% to 120% of a dopant dose of the first barrier region 1071 (which is of the first conductivity type).

(xiii) The dopant concentration of the first barrier region 1071 exhibits a third profile, wherein the third profile is an implantation profile.

Also in accordance with the embodiment schematically and exemplarily illustrated in FIG. 3, the active mesa 18 is configured with a non-symmetrical design regarding the source region section 101, which is only located at one side of the first contact plug 111. The region where the inversion channel is induced in the active mesa 18 by means of the control electrodes 141 is indicated by the dashed rectangular sections in FIGS. 2 and 3.

As further schematically illustrated in FIG. 3, each power cell 1-1 may, e.g., comprises four mesas, e.g., two active mesas 18 and two auxiliary mesas 19. For example, both active mesas 18 are laterally confined by two respective control trenches 14, and the two auxiliary mesas 19 laterally confined by one of the control trenches 14 on the one side and by the source trench 15 on the other side. Hence, in each power cell 1-1, two auxiliary mesas 19 may be arranged adjacent to each other and in between two active mesas 18. However, other contacting schemes are possible, as will become apparent from the description further below.

Further in accordance with the embodiment of FIG. 3, the pn-junctions 1021 formed within the active mesas 18 may be arranged at a slightly lower vertical level as compared to the pn-junctions 1922 formed within the auxiliary mesas 19. In another embodiment, the pn-junctions 1021 formed within the active mesas 18 may be arranged at a slightly higher vertical level as compared to the pn-junctions 1922 formed within the auxiliary mesas 19. In other words, the first semiconductor portion 191 may extend along the extension direction Z as far as 70% to 110% of the level of the -junctions 1021. For example, such vertical aligning can be achieved by forming the channel region sections 102 with the same, a slightly higher or a slightly lower implantation dose as compared to the first semiconductor portions 191.

Another contacting scheme of the power cell 1-1 is schematically and exemplarily illustrated in FIG. 4. Accordingly, two adjacent active mesas 18 may be arranged adjacent to two adjacent auxiliary mesas 19. Again, with respect to the arrangement of the source region sections 101, the active mesas 18 may exhibit a non-symmetrical design, according to which the source region sections 101 are only located at one side of the first contact plug 111. As further illustrated in FIG. 4, the active mesa 18 may comprise a plurality of source sections 101 that may be spatially separated from each other along the second lateral direction Y. Further in accordance with the embodiment schematically and exemplarily illustrated in FIG. 4, the transition between the second barrier region 1072 and the drift region 100 may be located approximately at the level of the trench bottoms 145 and 155, as has already been indicated above.

Now referring in more detail to the embodiment schematically and exemplarily illustrated in FIG. 6, it shall be understood that each power cell 1-1 may not only comprise at least one active mesa 18, at least one auxiliary mesa 19 that are laterally confined by a number of control trenches 14 and at least one source trench 15, but that each power cell 1-1 may further comprise at least one further trench 17 and/or at least one further mesa 16.

For example, the further trench 17 includes a further electrode 171 that is electrically insulated from the semiconductor body 10 by means of a further trench insulator 172. The further trench 17 may exhibit identical spatial dimensions as compared to the control trenches 14 and the source trench 15.

For example, the trench electrode 171 has an electrical potential different from the electrical potential of the control electrodes 141 and/or different from the electrical potential of the source trench 151. For example, the further electrode 171 is electrically floating. In another embodiment, the further electrode 171 is electrically coupled or, respectively, electrically connected to the control electrodes 141.

The further mesa 16 may have a different semiconductor configuration as compared to the active mesa 18 and as compared to the auxiliary mesa 19, as will be explained in more detail with respect to the remaining drawings. Irrespective of the semiconductor configuration of the further mesa 16, the further mesa 16 may exhibit equal spatial dimensions as compared to the auxiliary mesa 19 and as compared to the active mesa 18.

Figure 7:
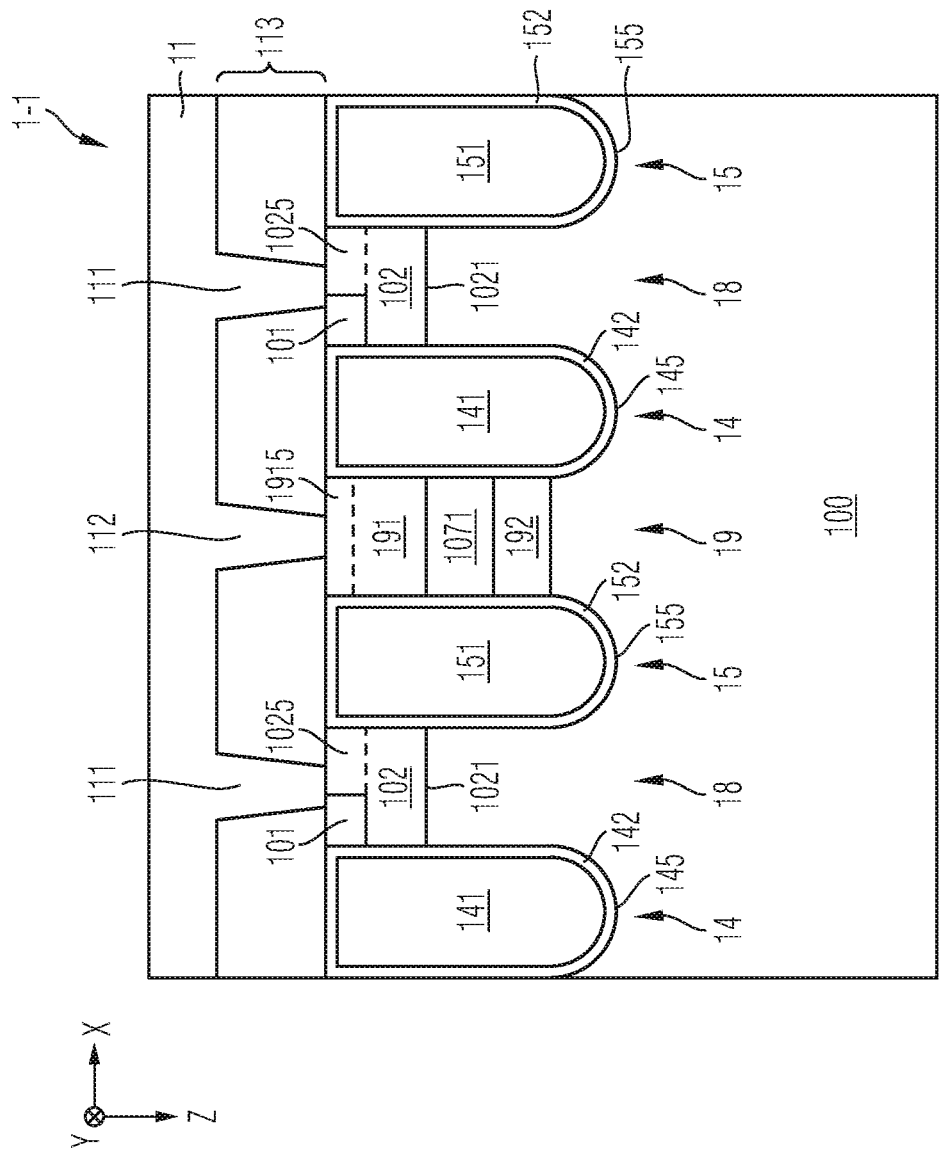
Figure 8:
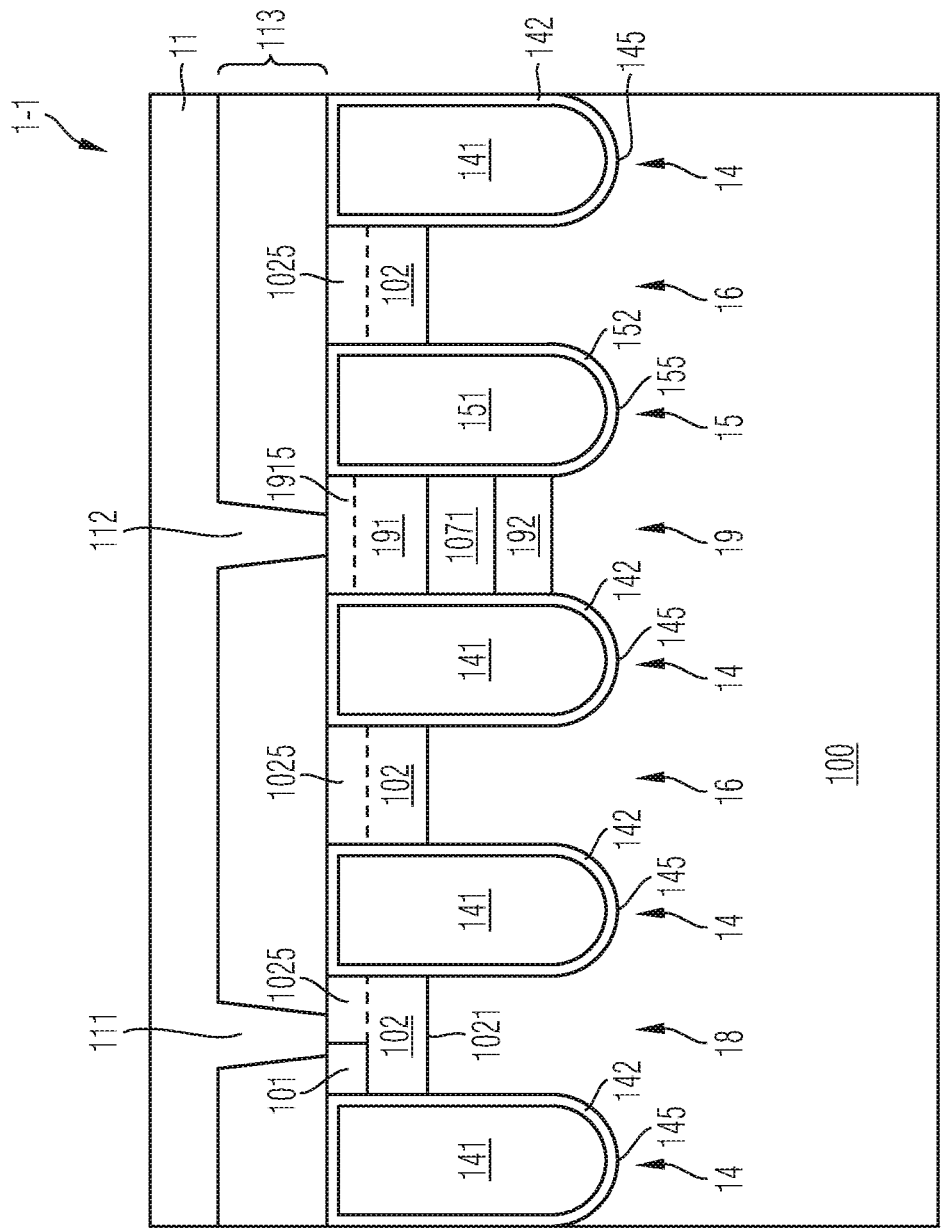

With respect to the embodiments schematically and exemplarily illustrated in FIGS. 7 and 8, some further optional aspects of the power semiconductor device 1 shall be described.

For example, neither the first contact plugs 111 for electrically contacting the active mesas 18 nor the second contact plugs 112 for electrically contacting the auxiliary mesas 19 must necessarily extend significantly further along the vertical direction Z as compared to the bottom of the insulation layer 113. For example, the first contact plugs 111 and the second contact plugs 112 are configured as planar contact plugs that terminate approximately at the level of the bottom of the insulation layer 113, as illustrated in FIGS. 7 and 8.

For increasing the conductivity of the electrical connection between the mesas 18 and 19 on the one side and the first load terminal 11 on the other side, the channel region section 102 of the active mesa 18 may comprise the channel subregion 1025 already mentioned above. The channel subregion 1025 may be provided with a significantly increased dopant concentration as compared to the remaining portion of the channel region section 102. Analogously, the first semiconductor portion 191 may comprise subregion 1915 that forms the interface between the second contact plug 112 and the remaining portion of the first semiconductor portion 191 this subregion 1915 may exhibit the same dopant concentration as the channel subregion 1025.

As further illustrated in FIG. 7, it shall be understood that the second barrier region 1072 must not necessarily be provided. For example, the pn-junction 1022 within the active mesa 18 may also be formed between the channel region section 102 and the drift region 100.

FIG. 7 further shows another exemplary contacting scheme, according to which each power cell 1-1 comprises two active mesas 18 and two auxiliary mesas 19 that are arranged in an alternating manner along the first lateral direction X.

Now regarding the embodiment schematically and exemplarily illustrated in FIG. 8, within each power cell 1-1, the active mesa 18 and the auxiliary mesa 19 may be separated from each other by means of the further mesa 16 that has already been mentioned above with respect to the embodiment of FIG. 6.

For example, the further mesa 16 is a dummy mesa that is not configured to conduct the load current or a part thereof. For example, the dummy mesa 16 is not electrically connected to the first load terminal 11. The dummy mesa 16 can be considered as a decommissioned mesa that is not used for the purpose of carrying the load current. Hence, in a vertical cross-section, as illustrated, a transition between the dummy mesa 16 and the first load terminal 11 along the vertical direction Z does not provide for an electrically conductive path. For reasons of a uniform process, the dummy mesa 16 may nevertheless be provided with a section of the channel region 102 and, optionally, also with the channel region 1025, as illustrated. For example, the dummy mesa 16 has a configuration that prevents the load current from crossing the transition between the dummy mesa 16 and the first load terminal 11.

As has been indicated above, the power semiconductor device 1 can be an IGBT, e.g., an IGBT having a micropattern-trench (MPT) structure. For example, in accordance with the MPT structure, each of the trenches 14, 15 (and optionally 17) that may be included in each of the power cells 1-1 may exhibit substantially equal spatial dimensions and may be arranged in accordance with a regular pattern. For example, each of the trenches 14, 15 and 17 may exhibit a depth along the vertical direction Z within the range of 3 µm to 8 µm, and a width along the first lateral direction X within the range of 0.4 µm to 1.6 µm. Further, each of the trench electrodes 141, 151 (and optionally 171) of all trenches 14, 15 and 17 that may be included in the respective power cell 1-1 may substantially exhibit equal spatial dimensions. In addition, each of the trenches 14, 15 and 17 that may be included in the at least one power cell 1-1 can be arranged equidistantly along the first lateral direction X. For example, each of the auxiliary mesa 19 and the active mesa 18 and the dummy mesa 16 of each power cell 1-1 may exhibit the same width in the first lateral direction X, which may be within the range of 0.1 µm to 0.3 µm, within the range of 0.3 µm to 0.8 µm, or within the range of 0.8 µm to 1.4 µm. Further, the MPT-IGBT may include a plurality, e.g., more than 100, of such equally configured power cells 1-1.

Herein presented is also a method of processing a power semiconductor device. The semiconductor device has an IGBT-configuration and comprises: a semiconductor body coupled to a first load terminal and a second load terminal of the power semiconductor device, and being configured to conduct a load current between said terminals, and comprising a drift region of a first conductivity type; a control terminal for controlling the load current; a source region of the first conductivity type electrically connected with the first load terminal, and a channel region of a second conductivity type electrically connected with the first load terminal and isolating the source region from the drift region; an emitter region of the second conductivity type electrically connected to the second load terminal; at least one power cell. Each power cell includes at least three trenches arranged laterally adjacent to each other, wherein each of said trenches extends into the semiconductor body along a vertical direction and includes an insulator that insulates a respective electrode from the semiconductor body, wherein the at least three trenches include at least one control trench, whose electrode is electrically coupled to the control terminal, and a source trench, whose electrode is electrically coupled to the first load terminal; an active mesa for conduction of at least a part of the load current, the active mesa being laterally confined at least by one of the at least one control trench and comprising at least a respective section of each of the source region and the channel region. The method comprises providing, as a part of each of the at least one power cell, an auxiliary mesa laterally confined by the source trench and one of the at least one control trench, the auxiliary mesa comprising a first semiconductor portion and a second semiconductor portion, both of the second conductivity type, wherein the auxiliary mesa is electrically connected to the first load terminal by means of the first semiconductor portion, and wherein the second semiconductor portion is arranged below the first semiconductor portion while being spatially displaced therefrom along the vertical direction.

Embodiments of the method correspond to the embodiments of the power semiconductor device 1 presented above with respect to the drawings. In so far, it is referred to the above.

For example, the channel region section 102 within the active mesa 18 and the first semiconductor portion 191 within the auxiliary mesa 19 are produced simultaneously. Thereafter, either the channel region section 102 within the active mesa 18 or the first semiconductor portion 191 within the auxiliary mesa 19 may further be slightly modified with respect to, e.g., the dopant concentration, so as to achieve said difference in the inception voltages of the inversion channel (within the active mesa 18) and the accumulation channel (within the auxiliary mesa 19). In another embodiment, the channel region section 102 within the active mesa 18 and the first semiconductor portion 191 within the auxiliary mesa 19 are produced separately. E.g., an implantation dose used for forming the channel zone sections 102 can be higher than an implantation dose used for forming the first semiconductor portions 191, e.g., higher than 15%. E.g., thereby, the pn-junctions 1021 are arranged slightly deeper as compared to the pn-junctions 1922 (cf. FIG. 3).

Forming the semiconductor configurations of the active mesa 18 and the auxiliary mesa 19 may involve a plurality of implantation processing steps. E.g., the first barrier region 1071 is formed by means of an high energy implantation, e.g., an implantation energy of 500 keV or more is used. An implantation energy employed for forming the second semiconductor portion 192 can be even higher, e.g., 700 keV or higher. An implantation energy employed for forming the second barrier region 1072 can be even higher, e.g., 2.5 MeV or higher, e.g., at implantation dose of $2.5*10^{13}$ cm$^{-2}$.

For example, for forming n-doped portions in the active mesa 18 and the auxiliary mesa 19, boron is implanted, e.g., forming the first and the second barrier regions 1071 and 1072. For forming p-doped portions in the active mesa 18 and the auxiliary mesa 19, phosphorus and/or arsenic may be implanted, e.g., for forming the channel region section 102 and both the first and the second semiconductor portions 191 and 192.

The method can be carried out so as to achieve regions 101, 102, 1072, 191, 1071, 192 with the dimensions and concentrations exemplarily stated above.

In the above, embodiments pertaining to power semiconductor devices and corresponding processing methods were explained. For example, these semiconductor devices are based on silicon (Si). Accordingly, a monocrystalline semiconductor region or layer, e.g., the semiconductor body 10 and its regions/zones can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C$_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device having an IGBT-configuration, the power semiconductor device comprising:
    a semiconductor body coupled to a first load terminal and a second load terminal of the power semiconductor device, the semiconductor body configured to conduct a load current between the first and the second load terminals and comprising a drift region of a first conductivity type;
    a control terminal for controlling the load current;
    a source region of the first conductivity type electrically connected to the first load terminal;
    a channel region of a second conductivity type electrically connected to the first load terminal and isolating the source region from the drift region;
    an emitter region of the second conductivity type electrically connected to the second load terminal;
    at least one power cell, each power cell comprising:
        at least three trenches arranged laterally adjacent to each other, each trench extending into the semiconductor body along a vertical direction and including an insulator that insulates a respective electrode from the semiconductor body, the at least three trenches including at least one control trench whose electrode is electrically coupled to the control terminal, and a source trench whose electrode is electrically coupled to the first load terminal;
        an active mesa for conduction of at least a part of the load current, the active mesa being laterally confined at least by one of the at least one control trench and comprising at least a respective section of each of the source region and the channel region; and an auxiliary mesa laterally confined by the source trench and one of the at least one control trench, the auxiliary mesa comprising a first semiconductor portion and a second semiconductor portion of the second conductivity type, the auxiliary mesa being electrically connected to the first load terminal by the first semiconductor portion, and the second semiconductor portion being arranged below the first semiconductor portion while being spatially displaced from the first semiconductor portion along the vertical direction.

2. The power semiconductor device of claim 1, wherein the first semiconductor portion of the auxiliary mesa is a section of the channel region.

3. The power semiconductor device of claim 1, wherein the auxiliary mesa comprises a first barrier region of the first conductivity type having a dopant concentration at least twice as great as a dopant concentration of the drift region.

4. The power semiconductor device of claim 3, wherein the first barrier region separates the first semiconductor portion and the second semiconductor portion from each other.

5. The power semiconductor device of claim 3, wherein the active mesa includes a second barrier region of the first conductivity type having a dopant concentration at least twice as great as a dopant concentration of the drift region, and wherein the second barrier region separates the channel region section from the drift region.

6. The power semiconductor device of claim 5, wherein the second barrier region extends along the vertical direction at least into a deepest tenth part of the active mesa.

7. The power semiconductor device of claim 5, wherein the dopant concentration of the first barrier region is within the range of 90% to 130% of the dopant concentration of the second barrier region.

8. The power semiconductor device of claim 5, wherein a transition between the channel region section and the second barrier region forms a second pn-junction at a second level within the active mesa, and wherein the first semiconductor portion extends along the extension direction as far as 70% to 110% of the second level.

9. The power semiconductor device of claim 3, wherein the dopant concentration of the second semiconductor portion has an implantation profile that has a dopant dose within the range of 80% to 120% of a dopant dose of the first barrier region.

10. The power semiconductor device of claim 3, wherein the dopant concentration of the first barrier region has an implantation profile.

11. The power semiconductor device of claim 1, wherein the auxiliary mesa is electrically connected to the first load terminal exclusively by the first semiconductor portion and/or wherein the auxiliary mesa is coupled to the drift region exclusively by the second semiconductor portion.

12. The power semiconductor device of claim 1, wherein a dopant concentration of the first semiconductor portion is greater than a dopant concentration of the second semiconductor portion.

13. The power semiconductor device of claim 1, wherein a dopant concentration of the first semiconductor portion has a first profile identical to a dopant concentration profile of the channel region section.

14. The power semiconductor device of claim 1, wherein a transition between the second semiconductor portion and the drift region forms a third pn-junction, and wherein the third pn-junction is arranged within the auxiliary mesa.

15. The power semiconductor device of claim 14, wherein a distance along the extension direction between the third pn-junction and a bottom of the source trench is at least on tenth of a total extension of the auxiliary mesa along the extension direction.

16. The power semiconductor device of claim 1, wherein the auxiliary mesa is configured to prevent a first current of charge carriers of the first conductivity type from crossing a transition between the auxiliary mesa and the first load terminal and to allow a second current of charge carriers of the second conductivity type to cross the transition.

17. The power semiconductor device of claim 1, wherein the emitter region laterally overlaps with the entire auxiliary mesa.

18. The power semiconductor device of claim 1, wherein the power semiconductor device is configured to be set into a conducting state if a control signal provided to the control electrode has a value within a first value range and into a blocking state if the control signal has a value within a second value range, and wherein an electric resistivity of the auxiliary mesa is responsive to the value of the control signal, the electric resistivity being greater if the control signal has a value within the first value range as compared to the electric resistivity present when the control signal has a value within the second value range.

19. The power semiconductor device of claim 18, wherein the electric resistivity of the auxiliary mesa has a momentary minimum during a change of the value of the control signal from a value within the first value range to a value within the second value range.

20. The power semiconductor device of claim 1, wherein the active mesa is configured to conduct at least a part of the load current by an inversion channel induced within a section of the channel region having a first inception voltage, and wherein the auxiliary mesa is configured to conduct at least a part of the load current by means of an accumulation channel having a second inception voltage.

21. The power semiconductor device of claim 20, wherein the second inception voltage is different from the first inception voltage.

22. A method of manufacturing a power semiconductor device having an IGBT-configuration, the method comprising:
coupling a semiconductor body to a first load terminal and a second load terminal of the power semiconductor device, the semiconductor body configured to conduct a load current between the first and the second load terminals and comprising a drift region of a first conductivity type;
providing a control terminal for controlling the load current;
electrically connecting a source region of the first conductivity type to the first load terminal;
electrically connecting a channel region of a second conductivity type to the first load terminal, the channel region isolating the source region from the drift region;
electrically connecting an emitter region of the second conductivity type to the second load terminal;
forming at least one power cell, each power cell comprising:
at least three trenches arranged laterally adjacent to each other, each trench extending into the semiconductor body along a vertical direction and including an insulator that insulates a respective electrode from the semiconductor body, the at least three trenches including at least one control trench whose electrode is electrically coupled to the control terminal, and a source trench whose electrode is electrically coupled to the first load terminal;

an active mesa for conduction of at least a part of the load current, the active mesa being laterally confined at least by one of the at least one control trench and comprising at least a respective section of each of the source region and the channel region; and an auxiliary mesa laterally confined by the source trench and one of the at least one control trench, the auxiliary mesa comprising a first semiconductor portion and a second semiconductor portion of the second conductivity type, the auxiliary mesa being electrically connected to the first load terminal by the first semiconductor portion, and the second semiconductor portion being arranged below the first semiconductor portion while being spatially displaced from the first semiconductor portion along the vertical direction.

23. The method of claim 22, wherein the channel region within the active mesa and the first semiconductor portion within the auxiliary mesa are formed simultaneously.

* * * * *

UNITED STATES PATENT AND TRADEMARK OFFICE
CERTIFICATE OF CORRECTION

PATENT NO. : 10,644,141 B2
APPLICATION NO. : 16/241303
DATED : May 5, 2020
INVENTOR(S) : Leendertz et al.

Page 1 of 1

It is certified that error appears in the above-identified patent and that said Letters Patent is hereby corrected as shown below:

In the Claims

Column 20, Line 5 (Claim 15, Line 3), please change "least on" to -- least one --.

Signed and Sealed this
Eleventh Day of August, 2020

Andrei Iancu
*Director of the United States Patent and Trademark Office*